(12) United States Patent
Shin et al.

(10) Patent No.: US 9,660,219 B2
(45) Date of Patent: May 23, 2017

(54) METHODS OF MANUFACTURING DISPLAY DEVICES

(71) Applicant: SAMSUNG DISPLAY CO., LTD., Yongin, Gyeonggi-Do (KR)

(72) Inventors: Dong-Woo Shin, Yongin (KR); Seung-Wook Chang, Yongin (KR); Young-Hee Lee, Yongin (KR); Chun-Gi You, Yongin (KR); Pil-Soo Ahn, Yongin (KR); Byoung-Ki Choi, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/732,346

(22) Filed: Jun. 5, 2015

(65) Prior Publication Data
US 2015/0270510 A1    Sep. 24, 2015

Related U.S. Application Data

(62) Division of application No. 13/137,266, filed on Aug. 2, 2011, now Pat. No. 9,054,337.

(30) Foreign Application Priority Data

Oct. 22, 2010    (KR) ........................ 10-2010-0103375

(51) Int. Cl.
*H01L 51/52*    (2006.01)
*H01L 51/50*    (2006.01)
*H01L 27/32*    (2006.01)

(52) U.S. Cl.
CPC ...... *H01L 51/5265* (2013.01); *H01L 27/3248* (2013.01); *H01L 51/5036* (2013.01);
(Continued)

(58) Field of Classification Search
CPC .......... H01L 2251/558; H01L 27/3244; H01L 27/3248; H01L 27/3258; H01L 51/5036;
(Continued)

(56) References Cited

U.S. PATENT DOCUMENTS

| 7,098,590 B2 | 8/2006 | Lim et al. |
| 7,432,648 B2 | 10/2008 | Lee et al. |

(Continued)

FOREIGN PATENT DOCUMENTS

| KR | 10-2005-0095099 A | 9/2005 |
| KR | 10-2006-0047486 A | 5/2006 |

OTHER PUBLICATIONS

Korean Office Action dated Jun. 21, 2016.

*Primary Examiner* — Donald Raleigh
*Assistant Examiner* — Kevin Quarterman
(74) *Attorney, Agent, or Firm* — Lee & Morse P.C.

(57) ABSTRACT

A display device includes a first optical resonance layer on a substrate, a switching structure on the first optical resonance layer, a first electrode on the switching structure, a light emitting structure on the first electrode, and a second electrode on the emitting structure. The switching structure may include a switching device and an optical distance controlling insulation layer covering the switching device. A first optical resonance distance for an optical resonance of the light may be provided between an upper face of the first optical resonance layer and a bottom face of the second electrode.

16 Claims, 8 Drawing Sheets

(52) U.S. Cl.
CPC ...... *H01L 51/5206* (2013.01); *H01L 51/5275* (2013.01); *H01L 27/3244* (2013.01); *H01L 27/3258* (2013.01); *H01L 2251/558* (2013.01)

(58) Field of Classification Search
CPC ............. H01L 51/5206; H01L 51/5265; H01L 51/5275
USPC ............................... 445/23–25; 313/498–512
See application file for complete search history.

(56) References Cited

U.S. PATENT DOCUMENTS

| | | |
|---|---|---|
| 2005/0127820 A1 | 6/2005 | Yamazaki et al. |
| 2005/0140277 A1 | 6/2005 | Suzuki et al. |
| 2005/0285516 A1 | 12/2005 | Godo et al. |
| 2006/0012295 A1 | 1/2006 | Kobayashi |
| 2006/0138945 A1* | 6/2006 | Wolk ................... H01L 27/3211 313/506 |
| 2007/0013282 A1 | 1/2007 | Okutani et al. |
| 2009/0096359 A1 | 4/2009 | Lee et al. |
| 2010/0052523 A1 | 3/2010 | Kim et al. |
| 2011/0133634 A1 | 6/2011 | Jeong et al. |
| 2012/0032584 A1* | 2/2012 | Mizuno ............... H01L 27/3211 313/504 |

\* cited by examiner

METHODS OF MANUFACTURING DISPLAY DEVICES

CROSS REFERENCE TO RELATED APPLICATION

This is a divisional application based on pending application Ser. No. 13/137,266, filed Aug. 2, 2011, the entire contents of which is hereby incorporated by reference.

BACKGROUND

1. Field

Example embodiments of the inventive concept relate to display devices and methods of manufacturing display devices. More particularly, example embodiments of the inventive concept relate to organic light emitting devices and methods of manufacturing organic light emitting devices.

2. Description of the Related Art

An organic light emitting device (OLED) may display desired information such as images, letters and/or characters using a light generated by combining holes provided from an anode with electrons provided from a cathode in an organic layer thereof. In various display devices, for example, liquid crystal display devices, plasma display panels, field emission display devices, etc., the OLED has been widely employed in various electronic and electric apparatuses such as televisions, mobile communication apparatuses, monitors, MP3 players or portable display apparatuses because the OLED may ensure relatively large view angle, rapid response speed, small thickness, low power consumption, etc. Accordingly, the OLED may be certainly expected to be one of the most prospecting next-generation display devices.

As for the conventional OLED, excitons are generated in an emitting layer by the recombination of holes and electrons provided from electrodes, and then a light having a predetermined wave length is generated from the energy the excitons to produce a desired image. However, the conventional OLED may have a relatively low luminous efficiency in accordance with the reduction of light transmittance caused by an internal reflection in the OLED, the destructive interference of the light reflected from the electrodes and/or other internal layers, etc. Additionally, the conventional OLED may not ensure a high color purity because the emission spectrum of the light may exist in a relatively large waveband. Furthermore, the number of the layers in the conventional OLED may increase to improve the reflect property of the light, however, manufacturing processes for the layers may be considerably complicated since the number of the stacked layers and the thickness of each layer may be accurately adjusted in order to precisely control the reflectivity of lights having predetermined wavelengths.

SUMMARY

Embodiments are therefore directed to a display device, which substantially overcome one or more of the problems due to the limitations and disadvantages of the related art.

It is therefore a feature of an embodiment to provide a display device ensuring improved color purity and enhanced luminance efficiency.

It is therefore another feature of an embodiment to provide a method of manufacturing a display device having high color purity and luminance efficiency with simplified processes.

At least one of the above and other features and advantages may be realized by providing a display device including a substrate, a first optical resonance layer, a switching structure, a first electrode, a light emitting structure, and a second electrode. The first optical resonance layer may be disposed on a substrate. The first optical resonance layer may include a metal film. The switching structure may be positioned on the first optical resonance layer. The switching structure may include a switching device and an optical distance controlling insulation layer covering the switching device. The first electrode may be positioned on the switching structure and the light emitting structure may be disposed on the first electrode. The second electrode may locate on the light emitting structure. A first optical resonance distance for an optical resonance of the light may be provided between an upper face of the first optical resonance layer and a bottom surface of the second electrode.

In example embodiments, the first optical distance may be determined to simultaneously generate optical resonances of red light, green light, and blue light.

In example embodiments, the first optical resonance distance may be adjusted by controlling a thickness of the optical distance controlling insulation layer and/or a refraction index of the optical distance controlling insulation layer.

In example embodiments, the display device may additionally include a buffer layer disposed between the substrate and the first optical resonance layer.

In example embodiments, the first optical resonance layer may be semi-transparent. For example, the first optical resonance layer may include a single thin metal film. The first electrode may be transparent and the second electrode may be reflective or semi-transparent.

In example embodiments, the first electrode may be semi-transparent and a second optical resonance distance for an optical resonance of the light generated from the light emitting structure may be provided between the upper face of the first optical resonance layer and a bottom face of the first electrode. The second optical resonance distance may be adjusted by controlling a thickness of the optical distance controlling insulation layer and/or a refraction index of the optical distance controlling insulation layer.

In example embodiments, a third optical resonance distance for an optical resonance of the light may be provided between an upper face of the first electrode and the bottom face of the second electrode. Each of the first, the second, and the third optical resonance distances may be determined to generate one peak wavelength within a wavelength band of a visible light. Alternatively, the first, the second, and the third optical resonance distances may be determined to generate peak wavelengths corresponding to different color lights having wavelengths within wavelength bands of visible lights. Furthermore, the first, the second and the third optical resonance distances may be determined to simultaneously generate optical resonances of red light, green light and blue light.

In example embodiments, the first optical resonance layer may be reflective and the second electrode may be semi-transparent.

In example embodiments, the display device may further include an optical distance controlling layer disposed on the second electrode, and a second optical resonance layer disposed on the optical resonance controlling layer. The second electrode may be semi-transparent and a second optical resonance distance may be provided between an upper face of the second electrode and a bottom face of the second optical resonance layer. The second optical resonance distance may be adjusted by controlling a thickness of the optical distance controlling layer and/or a refraction index of the optical distance controlling layer. A third optical resonance distance may be provided between the upper face of the first optical resonance layer and a bottom face of the second optical resonance layer. Each of the first, the second, and the third optical resonance distances may be determined to generate one peak wavelength within a wavelength band of visible light. Alternatively, the first, the second, and the third optical resonance distances may be determined to generate peak wavelengths corresponding to different color lights having wavelengths within wavelength bands of visible lights. Furthermore, the first, the second, and the third optical resonance distances may be determined to simultaneously generate optical resonances of red light, green light and blue light.

According to another aspect of example embodiments, there is provided a display device including a substrate, a first electrode, a light emitting structure, a second electrode, an optical distance controlling layer, and a first optical resonance layer having a reflectivity. The first electrode may be disposed on the substrate, and the light emitting structure may be positioned on the first electrode. The second electrode may be formed on the light emitting structure. The optical distance controlling layer may locate on the second electrode. The first optical resonance layer may be disposed on the optical distance controlling layer. A first optical resonance distance for an optical resonance of the light may be provided between an upper face of the first electrode and a bottom face of the first optical resonance layer.

In example embodiments, the first optical resonance distance may be determined to simultaneously generate optical resonances of red light, green light, and blue light.

In example embodiments, the first optical resonance distance may be adjusted by controlling a thickness of the optical distance controlling layer and/or a refraction index of the optical distance controlling layer.

In example embodiments, the second electrode may be semi-transparent and a second optical resonance distance for an optical resonance of the light may be provided between an upper face of the second electrode and the bottom face of the first optical resonance layer. The second optical resonance layer may be adjusted by controlling a thickness of the optical distance controlling layer and/or a refraction index of the optical distance controlling layer.

In example embodiments, a third optical resonance distance for an optical resonance of the light may be provided between the upper face of the first electrode and a bottom face of the second electrode. Each of the first, the second, and the third optical resonance distances may be determined to generate one peak wavelength within a wavelength band of a visible light. Alternatively, the first, the second, and the third optical resonance distances may be determined to generate peak wavelengths corresponding to different colors of light having wavelengths within wavelength bands of visible lights.

In example embodiments, the first optical resonance layer may be reflective and the first electrode is semi-transparent. Alternatively, the first optical resonance layer may be semi-transparent and the first electrode may be reflective or semi-transparent.

In example embodiments, the display device may further include a switching structure disposed between the substrate and the first electrode, and a second optical resonance layer disposed between the substrate and the switching structure. The switching structure may include a switching device and an optical distance controlling insulation layer. The first electrode may be semi-transparent and a second optical resonance distance for an optical resonance of the light may be provided between an upper face of the second optical resonance layer and a bottom face of the first electrode. The second optical resonance distance may be adjusted by controlling a thickness of the optical distance controlling insulation layer and/or a refraction index of the optical distance controlling insulation layer. A third optical resonance distance for an optical resonance of the light may be provided between a bottom face of the first optical resonance layer and an upper face of the second optical resonance layer. Each of the first, the second, and the third optical resonance distances may be determined to generate one peak wavelength within a wavelength band of visible light. Alternatively, the first, the second, and the third optical resonance distances may be determined to generate peak wavelengths corresponding to different color lights having wavelengths within wavelength bands of visible lights.

According to still another aspect of example embodiments, there is provided a display device including a first optical resonance layer on a substrate, a switching structure on the first optical resonance layer, a first electrode on the switching structure, a light emitting structure on the first electrode, a second electrode on the light emitting structure, an optical distance controlling layer on the second electrode, and a second optical resonance layer on the optical distance controlling layer. The switching structure may include a switching device and an optical distance controlling insulation layer covering the switching device. The second optical resonance layer may provide a first optical resonance distance for an optical resonance of the light between an upper face of the first optical resonance layer and a bottom of the second optical resonance layer.

In example embodiments, the first resonance optical distance may be determined to simultaneously generate optical resonances of red light, green light, and blue light.

In example embodiments, the first optical resonance distance may be adjusted by controlling a thickness of the optical distance controlling insulation layer and/or a refraction index of the optical distance controlling insulation layer. Further, the first optical resonance distance may be adjusted by controlling a thickness of the optical distance controlling layer and/or a refraction index of the optical distance controlling layer.

In example embodiments, the first optical resonance distance may be adjusted by simultaneously or respectively controlling a thickness of the optical distance controlling insulation layer, a refraction index of the optical distance controlling insulation layer, a thickness of the optical distance controlling layer, and/or a refraction index of the optical distance controlling layer.

In example embodiments, the first optical resonance layer may be semi-transparent and the second optical resonance layer may be reflective.

In example embodiments, at least one of the first electrode and the second electrode may include a semi-transparent electrode and the semi-transparent electrode may provide a second optical resonance distance for an optical resonance of the light between the upper face of the first optical resonance layer and a bottom face of the semi-transparent electrode. The second optical resonance distance may be adjusted by controlling a thickness of the optical distance controlling insulation layer and/or a refraction index of the optical distance controlling insulation layer. The semi-transparent electrode may additionally provide a third optical resonance distance for an optical resonance of the light between an upper face of the semi-transparent electrode and a bottom face of the second optical resonance layer. The third optical resonance distance may be adjusted by controlling a thickness of the optical distance controlling layer and/or a refraction index of the optical distance controlling layer. Each of the first, the second, and the third optical resonance distances may be determined to generate one peak wavelength within a wavelength band of visible light. Alternatively, the first, the second, and the third optical resonance distances may be determined to generate peak wavelengths corresponding to different colors of light having wavelengths within wavelength bands of visible lights.

At least one of the above and other features and advantages may also be realized by providing a method of manufacturing a display device. In the method of manufacturing the display device, a first unit may be formed on a substrate. The first unit may include a first electrode, a light emitting structure, and a second electrode. A second unit including a first optical resonance layer and an optical distance controlling layer may be formed. The first unit may be combined with the second unit.

In formation of the first unit according to example embodiments, a second optical resonance layer and a switching structure may be formed between the substrate and the first electrode.

In formation of the switching structure, a switching device may be formed between the substrate and the first electrode. An optical distance controlling insulation layer may be formed to cover the switching device.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
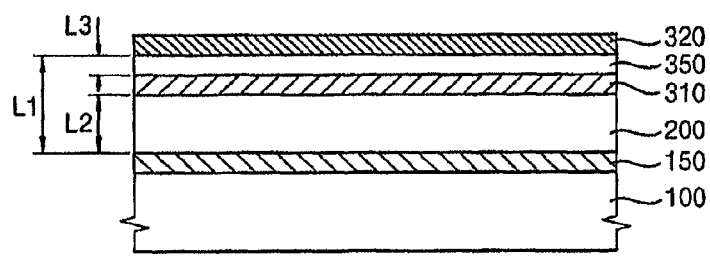
FIG. 1 illustrates a cross sectional view of a display device in accordance with example embodiments.

Korean Patent Application No. 10-2010-0103375, filed on Oct. 22, 2010, in the Korean Intellectual Property Office, and entitled: "Display Devices and Methods of Manufacturing Display Devices," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The example embodiments are described more fully hereinafter with reference to the accompanying drawings; however, they may be embodied in many different forms and should not be construed as limited to the example embodiments set forth herein. Rather, these embodiments and provided so that this disclosure will be through and complete, and will fully convey the scope of the invention to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
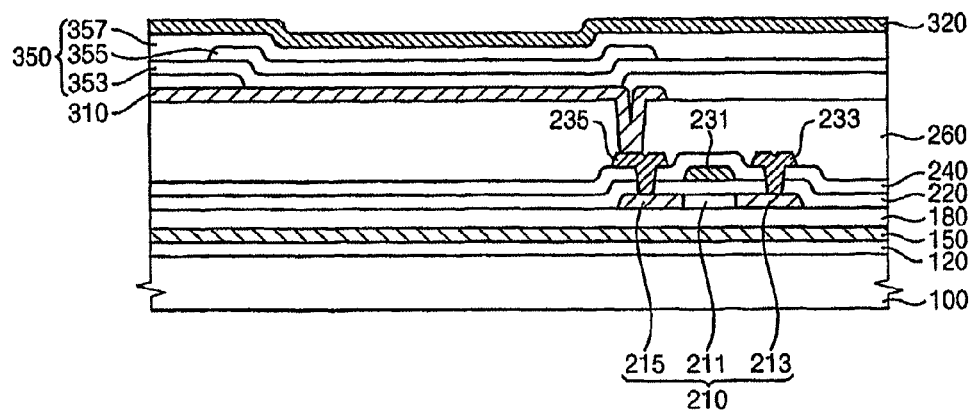
FIG. 2 illustrates a cross sectional view of a display device having an active matrix type in accordance with example embodiments.

FIG. 1 is a cross sectional view illustrating a display device in accordance with example embodiments. FIG. 2 is a cross sectional view illustrating a display device having an active matrix (AM) type in accordance with example embodiments.

Referring to FIGS. 1 and 2, the display device includes a substrate 100, an optical resonance layer 150, a switching structure 200, a first electrode 310, a light emitting structure 350 and a second electrode 320.

The switching structure 200 may be located between the optical resonance layer 150 and the first electrode 310. Here, the switching structure 200 may be disposed below the first electrode 310, the second electrode 320 and the light emitting structure 350. The light emitting structure 350 may be disposed between the first electrode 310 and the second electrode 320.

In example embodiments, the substrate 100 may include a transparent substrate. For example, the substrate 100 may include a glass substrate, a transparent plastic substrate, a transparent parent metal oxide substrate, etc. Further, the substrate 100 may include a flexible substrate.

When the display device may utilize the mechanism of organic electroluminescent, the light emitting structure 350 may include an organic layer. Here, the light emitting structure 350 includes a hole transferring layer (HTL) 353, an emitting layer (EL) 355 and an electron transferring layer (ETL) 357 as illustrated in FIG. 2. The emitting layer 355 may include different luminous materials relative to different color pixel regions of the display device to generate different colors of lights, e.g. red light, green light, blue light, etc. In some example embodiments, the emitting layer 355 may include a mixture of different luminous materials generating different colors of light. Alternatively, the emitting layer 355 may have a multi layer structure that includes a plurality of layers for generating the colors of light, e.g. red light, green light, blue light, etc. Here, the emitting layer 355 may emit white light.

In example embodiments, the first electrode 310 may serve as an anode for providing the hole transferring layer 353 with holes whereas the second electrode 320 may serve as a cathode for supplying the electron transferring layer 357 with electrons. To reduce a driving voltage of the display device while enhancing luminous efficiency thereof, a hole injection layer (HIL) (not illustrated) may be interposed between the first electrode 310 and the hole transferring layer 353. Additionally, an electron injection layer (EIL) may be disposed between the electron transferring layer 357 and the second electrode 320. However, the inventive concept may not be limited to the above-described construction. In some example embodiments, the first electrode 310 and the second electrode 320 may serve as a cathode and an anode, respectively. In this case, an electron transferring layer, an emitting layer, a hole transferring layer and the second electrode 320 may be successively provided on the first electrode 310.

According to some example embodiments, when the light emitting structure 350 includes a plurality of emitting layers generating different colors of light to produce white light, the display device may also include a color filter corresponding to the light emitting structure 350. In another example embodiment, the color filter may not be required when the light emitting structure 350 includes different luminous materials for generating different colors of light in respective color pixel regions.

When the display device has an active matrix type, the display device may further includes the switching structure 200 positioned between the substrate 100 and the first electrode 310. The switching structure 200, for example, may include insulation layers and a switching device such as a transistor.

When the switching device includes a thin film transistor (TFT), the switching device may have a gate electrode 231, a source electrode 233, a drain electrode 235, a semiconductor layer 210, and so forth. A gate signal may be applied to the gate electrode 231 and a source signal may be applied to the source electrode 233. The drain electrode 235 may be electrically connected to the first electrode 310. The semiconductor layer 210 may be connected to the source electrode 233 and the drain electrode 235. Here, the semiconductor layer 210 may include a source region 213 contacting the source electrode 233, a drain region 215 making contact with the drain electrode 235, and a channel region 211 generated between the source and the drain regions 213 and 215. A gate insulation layer 220 is disposed on the semiconductor layer 210 to electrically insulate the gate electrode 231 from the substrate 100. An insulating interlayer 240 is formed on the gate insulation layer 220 to cover the gate electrode 231.

In the switching device illustrated in FIG. 2, the TFT may have a top gate structure in which the gate electrode 231 is disposed over the semiconductor layer 210. However, the scope of example embodiments may not be limited to such a structure. For example, the TFT may have a bottom gate structure including a gate electrode located below a semiconductor layer.

The display device includes an optical distance controlling insulation layer 260. The optical distance controlling insulation layer 260 is disposed on the insulating interlayer 240 to cover the source electrode 233 and the drain electrode 235. The optical distance controlling insulation layer 260 may protect the switching device and may electrically insulate the switching device from upper structures. Additionally, the optical distance controlling insulation layer 260 may ensure or adjust at least one predetermined optical distance for an optical resonance of a light generated from the light emitting structure 350 as described below. In example embodiments, the optical distance controlling insulation layer 260 may have a predetermined light transmittance. For example, the optical distance controlling insulation layer 260 may have a light transmittance of about 70% to about 100% relative to an incident light.

The optical distance controlling insulation layer 260 may include an organic insulation material or an inorganic insulation material. For example, the optical distance controlling insulation layer 260 may include benzocyclobutene (BCB), polyimide, parylene, polyvinylphenol (PVP), aluminum oxide (AlOx), barium oxide (BaOx), magnesium oxide (MgOx), hafnium oxide (HfOx), zirconium oxide (ZrOx), calcium oxide (CaOx), strontium oxide (SrOx), yttrium oxide (YOx), silicon oxide (SiOx), aluminum nitride (AlNx), gallium nitride (GaNx), zinc sulfide (ZnSx), cadmium sulfide (CdSx), etc. Alternatively, the optical distance controlling insulation layer 260 may include a combination of the above organic and inorganic materials. In addition, the optical distance controlling insulation layer 260 may have a hybrid structure that includes at least one organic film containing the organic insulation material and at least one inorganic film containing the inorganic insulation material.

The optical resonance layer 150 is spaced apart from the first electrode 310 and the second electrode 320. According to example embodiments, the optical resonance layer 150 may produce at least one optical distance for the optical resonance of the light generated from the light emitting structure 350 with respect to at least one of the first electrode 310 and the second electrode 320. The term "optical resonance" or "microcavity effect" indicates the increase of luminance and/or intensity of light having a predetermined wavelength when an optical distance between two reflective or semi-transparent faces satisfies the conditions of constructive interference of the light having the predetermined wavelength. The term "reflective" may be used when there is reflectivity of about 70% to about 100% relative to an incident light. The term "semi-transparent" may be used when there is reflectivity of about 30% to about 70% relative to an incident light. According to an example embodiment, the optical distance may be substantially equal to a value obtained by multiplying the refraction index (n) of a layer and/or an electrode, and the thickness (d) of the layer or the electrode when a light passes through a predetermined layer or electrode. When the light passes through a plurality of layers or electrodes having different refraction indices, the whole optical distance of the plurality of layers or electrodes may be substantially equal to the sum ($\Sigma n \cdot d$) of respective optical distance ($n \cdot d$) of each layer or electrode.

When a plurality of layers or electrodes are disposed between the two reflective or semi-transparent faces, the optical resonance of light between the two reflective or semi-transparent faces may be represented by the following equation (1):

$$2\pi m = \sum_j \left( \frac{2\pi 2 n_j d_j}{\lambda} + \theta_j \right) \quad (1)$$

In the above equation (1), $n_j$ denotes an index of refraction of a jth layer or electrode among the plurality of layers or electrodes interposed between two reflective or semi-transparent faces when a light having a predetermined wavelength ($\lambda$) passes through the jth layer or electrode. Additionally, $d_j$ indicates a thickness of the jth layer or electrode and m represents arbitrary integer. Furthermore, $\theta_j$ means a phase change of the light when the light passes the jth layer or electrode or the light is reflected from the reflective or semi-transparent face. In case that the above equation (1) is modified relative to an optical distance, the following equation (2) may be obtained from the above equation (1):

$$L = \sum_j n_j d_j = \frac{\lambda}{2}\left(m - \sum \frac{\theta_j}{2\pi}\right) = \frac{\lambda}{2}\left(m - \frac{\Phi}{2\pi}\right) \quad (2)$$

As for the above equation (2), L represents an optical distance for generating the optical resonance of the light having the predetermined wavelength ($\lambda$). Hereinafter, the optical distance suitable for the optical resonance of the light having the predetermined wavelength may be referred to as "an optical resonance distance (L)." Further, $\Phi$ indicates the sum of phase changes of the light generated within the optical resonance distance (L). $\Phi$ may be in a range of $-\pi$ radian to $\pi$ radian. The term "peak wavelength" may be referred to as a wavelength of light generating an optical resonance within a specific optical resonance distance (L).

According to the above equation (2), the optical resonance distance (L) for producing the optical resonance of the light having the predetermined wavelength ($\lambda$) may vary in accordance with the integer (m). When the optical resonance distance (L) is relatively large, different integers (m) (i.e., the values of the above equation (2)) respectively corresponding to different peak wavelengths may be obtained within one optical resonance distance (L). If the sum of the phase changes of the light generated within the optical resonance distance (L) is zero and the optical resonance distance (L) is about 510 nm, the peak wavelength of the light generating the optical resonance within such optical resonance distance (L) may have several values of about 1,020 nm (m=1), about 510 nm (m=2), about 340 nm (m=3), about 255 nm (m=4), about 204 nm (m=5), about 170 nm (m=6), about 147.5 nm (m=7), etc. Therefore, a plurality of peak wavelengths may be obtained relative to one optical resonance distance (L). Generally, the visible wavelength band is about 400 nm to about 700 nm, so that, among the above-described several peak wavelengths, only the peak wavelength of about 510 nm (m=2) may be within the visible wavelength bands. Thus, only one peak wavelength may exist within the visible wavelength band when the optical resonance distance (L) has a relatively small value, e.g., of about 510 nm.

When the optical resonance distance (L) is determined to a relatively large value, e.g., about 1,275 nm, the peak wavelength of the light generating the optical resonance within this optical resonance distance (L) may have several values, i.e. about 2,550 nm (m=1), about 1,275 nm (m=2), about 850 nm (m=3), about 637.5 nm (m=4), about 510 nm (m=5), about 425 nm (m=6), about 364.3 nm (m=7), etc. The peak wavelengths of about 637.5 nm (m=4), about 510 nm (m=5), and about 425 nm (m=6) belong to the visible wavelength band. Thus, three peak wavelengths of visible light may be realized when the optical resonance distance (L) is relatively large. Accordingly, three different wavelengths of visible light may simultaneously resonate when the optical resonance distance (L) is a relatively large value, e.g. about 1,275 nm.

Figure 3:
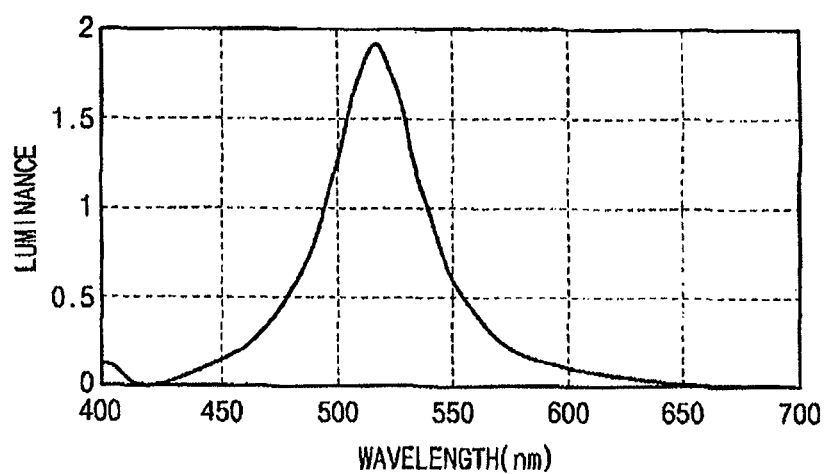
FIGS. 3 and 4 illustrate graphs of peak wavelengths within a visible wavelength band in accordance with example embodiments.
Figure 4:
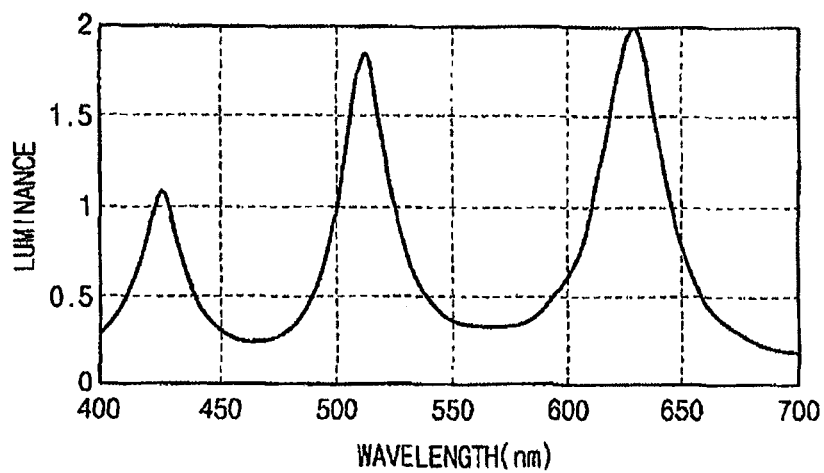

FIGS. 3 and 4 are graphs illustrating the peak wavelengths within the visible wavelength band. In FIGS. 3 and 4, a horizontal axis denotes the wavelength of light in nanometers and a vertical axis indicates the luminance of light by an arbitrary unit.

As illustrated in FIG. 3, only one visible peak wavelength, about 510 nm, may exist when the optical resonance distance (L) has a relatively small value, e.g. 510 nm. However, when the optical resonance distance (L) has a relatively large value, e.g. about 1,275 nm, three peak wavelengths, e.g. about 637.5 nm, about 510 nm, and about 425 nm may exist. These three peak visible wavelengths are illustrated in FIG. 4. Thus, the number of the peak wavelengths within the visible wavelength band of about 400 nm to about 700 nm, i.e. corresponding to that of visible light, may increase as the optical resonance distance (L) increases. Therefore, the optical resonance distance (L) may be properly adjusted to simultaneously generate a plurality of optical resonances relative to different wavelengths of visible light. In other words, lights having a plurality of different visible wavelengths may be simultaneously optically resonated by controlling the optical resonance distance (L).

In some example embodiments, the optical resonance distance (L) may be adjusted to simultaneously generate two optical resonances with respect to two different wavelengths of visible lights. In another example embodiment, the optical resonance distance (L) may be suitably controlled to generate four optical resonances of four different wavelengths of visible lights, respectively. As the optical resonance distance (L) increases, the peak wavelengths of the light within the visible wavelength band may also increase. Thus, a plurality of wavelengths of light may be simultaneously resonated in accordance with the control of the optical resonance distance (L). For example, red light may have a wavelength band of about 600 nm to about 650 nm, green light may have a wavelength band of about 500 nm to about 550 nm, and blue light may have a wavelength band of about 410 nm to about 460 nm. When the optical resonance distance (L) may be about 1.275 nm, optical resonances for the peak wavelengths of about 637.5 nm, about 519 nm, and about 425 nm, respectively corresponding to the red light, the green light, and the blue light, may simultaneously occur as described above.

As described above, since the whole optical distance may be the sum of respective optical distance of each layer and/or electrode obtained by multiplying the refraction indices and the geometrical thicknesses, the optical resonance distance (L) may be substantially smaller than the sum of the geometrical thicknesses of the layers and/or electrodes. An organic insulation material, an inorganic material, and an organic material employed in the display device may have refraction indices of about 1.5 to about 3.0, so that the optical resonance distance (L) may be in a range of about ⅓ to about ⅔.

Referring to FIGS. 1 and 2, the second electrode 320 may be a reflective electrode having reflectivity when the display device has a bottom emission type. The optical resonance layer 150 may be a semi-transparent layer for partially reflecting the incident light and partially transmitting the incident light. As described above, the reflective electrode may have a reflectivity of about 70% to about 100%, whereas the semi-transparent layer may have a reflectivity of about 30% to about 70%.

When the second electrode 320 is the reflective electrode, the second electrode 320 may include metal and/or alloy having a relatively high reflectivity. For example, the second electrode 320 may include silver (Ag), aluminum (Al), platinum (Pt), gold (Au), chrome (Cr), tungsten (W), molybdenum (Mo), titanium (Ti), palladium (Pa), an alloy thereof, etc. These may be used alone or in a combination thereof.

When the optical resonance layer 150 is semi-transparent, the optical resonance layer 150 may include a single thin metal film. The optical resonance layer 150 may ensure a desired reflectivity and a predetermined transmittance. When the thin metal film has a relatively thick thickness, the optical resonance layer 150 may have poor luminance efficiency. Thus, the thin metal film in the optical resonance layer 150 may have a thickness below about 30 nm. Examples of metal in the optical resonance layer 150 may include silver, an alloy containing silver, aluminum, an alloy containing aluminum, magnesium, an alloy containing magnesium, molybdenum, an alloy containing molybdenum, an alloy of Ag—Cu—Au (ACA), an alloy of Ag—Pa—Cu (APC), etc. These metals may be used alone or in a combination thereof. When the optical resonance layer 150 includes the thin metal film, the display device may further include a lower insulation layer 180 for electrically insulating the optical resonance layer 150 from the switching device because the optical resonance layer 150 may have electrical conductivity.

In some example embodiments, the optical resonance layer 150 may include other material for reflecting and transmitting incident light besides the thin metal film. In some example embodiments, the optical resonance layer 150 may have a multi layer structure that includes at least different transparent or semi-transparent films having different refraction indices.

According to example embodiments, the optical resonance layer 150 may provide at least one optical resonance distance for at least one optical resonance for the light generated from the light emitting structure 350 with respect to at least one of the first electrode 310 and the second electrode 320.

As for the display device illustrated in FIGS. 1 and 2, the optical resonance layer 150 is positioned between the substrate 100 and the switching structure 200. When the optical resonance layer 150 is semi-transparent and the second electrode 320 has reflectivity, an optical resonance of the light provided from the light emitting structure 350 may occur between an upper face of the optical resonance layer 150 and a bottom face of the second electrode 320. In example embodiments, the optical resonance layer 150 may form a first optical resonance distance (L1) relative to the second electrode 320. That is, the first optical resonance distance (L1) may be provided between the bottom face of the second electrode 320 and the upper face of the optical resonance layer 150.

According to example embodiments, the first optical resonance distance (L1) may be determined to simultaneously generate optical resonances of three different wavelengths of visible light, respectively. The optical resonance layer 150 may be separated from the first and the second electrodes 310 and 320. Thus, the optical resonance layer 150 may be spaced apart from the first electrode 310 by interposing the switching structure 200 therebetween. Accordingly, the first optical resonance distance (L1) may be substantially larger than an optical distance between the first electrode 310 and the second electrode 320.

The first optical resonance distance (L1) may be adjusted by controlling thicknesses and/or refraction indices of a plurality of layers disposed between the optical resonance layer 150 and the second electrode 320. When an optical distance between the bottom face of the second electrode 320 and the bottom face of the first electrode 310 is previously set, the first optical resonance distance (L1) may be adjusted by controlling a thickness and/or a refraction index of the switching structure 200 between the first electrode 310 and the optical resonance layer 150. For example, the first optical resonance distance (L1) may be adjusted to have a relatively large value to simultaneously generate the optical resonances of the three different visible lights. The optical resonances occur because the switching structure 200, including various insulation layers, may be located between the optical resonance layer 150 and the first electrode 310. For example, the first optical resonance distance (L1) may be controlled to generate three peak wavelengths corresponding to those of the red, the green and the blue light as illustrated in FIG. 4.

When the first optical resonance distance (L1) is determined for simultaneously generating the optical resonances of the red, the green and the blue light, the display device may have improved color purity without adjusting optical distances of respect color pixel regions of the display device. For example, the color pixel regions may not include emitting layers having different thicknesses. The color pixels may not include additional subsidiary electrodes having different thicknesses. The additional subsidiary electrodes having different thicknesses may not be required in order to control optical distances relative to the color pixel regions. Thus, the display device may be manufactured with low cost without requiring additional layers, electrodes, etc. In addition, the color pixels may be obtained without using different masks relative to the color pixels, because all of the color pixels in the display device may have substantially the same construction. Therefore, the processes for manufacturing the display device may be simplified. Furthermore, the thickness of various insulation layers including the optical distance controlling insulation layer 260 of the switching structure 200 may be easily and precisely controlled. Thus, because the thickness of various insulation layers may be easily and precisely controlled, the first optical resonance distance (L1) may also be accurately adjusted to cause an optical resonance of light having a desired wavelength. According to example embodiments, the optical resonance layer 150 may not serve as an electrode or a subsidiary electrode, so that the optical resonance layer 150 may not be patterned by the color pixel regions. Accordingly, the optical resonance layer 150 may be easily formed on the substrate 100.

The optical resonance layer 150 may be directly formed on the substrate 100. In some example embodiments, a buffer layer 120 may be disposed between the substrate 100 and the optical resonance layer 150. The buffer layer 120 may include an organic material or an inorganic material having a relatively large refraction index. The buffer layer 120 may have a refraction index substantially larger than that of the optical resonance layer 150 or that of the substrate 100. When the buffer layer 120 having the refraction index larger than that of the optical resonance layer 150 is interposed between the substrate 100 and the optical resonance layer 150, the reflectivity of the light at an interface between the buffer layer 120 and the optical resonance layer 150 may be improved. When the optical resonance layer 150 includes the thin metal film, the thin metal film may have a considerably thin thickness for transmitting the light. Thus, the thin metal film may not have sufficient reflectivity for generating the optical resonance of the light. When the buffer layer 120 having the relatively large refraction index is provided between the substrate 100 and the optical resonance layer 150, the reflectivity of the light at the interface between the buffer layer 120 and the optical resonance layer 150 may be enhanced. Additionally, the buffer layer 120 may enhance adhesion strength between the substrate 100 and the optical resonance layer 150.

Figure 5:
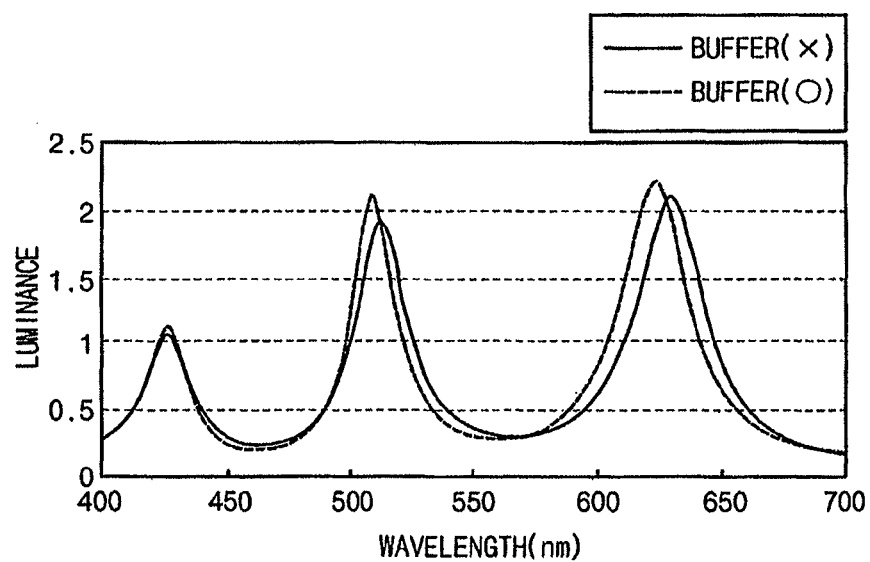
FIG. 5 illustrates a graph of luminance difference of peak wavelengths between a display device having a buffer layer and a display device without a buffer layer according to example embodiments.

FIG. 5 is a graph illustrating luminance difference of peak wavelengths between a display device having a buffer layer and a display device without a buffer layer.

As illustrated in FIG. 5, the display device, which includes a buffer layer between a substrate and an optical resonance layer, may ensure peak wavelengths higher than those of the display device which does not include a buffer layer. Therefore, the display device may have improved luminance when the display device includes the buffer layer.

In example embodiments, the first electrode 310 may be a transparent electrode having a predetermined transmittance. The first electrode 310 may be a transparent electrode having a transmittance of about 70% to about 100%. The first electrode may include transparent conductive metal oxide or transparent inorganic material doped with metal when the first electrode 310 is the transparent electrode. For example, the first electrode 310 may include indium tin oxide (ITO), indium zinc oxide (IZO), tin oxide (TO), zinc oxide (ZnOx), etc. Alternatively, the first electrode 310 may include silicon nitride, magnesium fluoride (MgFx), lithium fluoride (LiFx), silicon oxide or titanium oxide doped with lithium (Li), cesium (Cs), calcium (Ca), aluminum, etc. When the first electrode 310 is the transparent electrode, an optical resonance may not substantially occur between the optical resonance layer 150 and the first electrode 310 or between the first electrode 310 and the second electrode 320.

In some example embodiments, the first electrode 310 may be a semi-transparent electrode having a predetermined transmittance. For example, the first electrode 310 may be a semi-transparent electrode having a reflectivity in a range of about 30% to about 70%. The first electrode between the optical resonance layer 150 and the second electrode 320 may not have a relatively high reflectivity. The semi-transparent first electrode 310 may include a thin metal film substantially the same as or substantially similar to that of the optical resonance layer 150. Alternatively, the semi-transparent first electrode 310 may include other materials that may partially transmit and partially reflect an incident light.

When the first electrode 310 is the transparent electrode, an additional optical resonance structure may not be required except for the optical resonance structure between the optical resonance layer 150 and the second electrode 320. However, when the first electrode 310 is the semi-transparent electrode, the first electrode 310 may partially reflect the light generated from the light emitting structure 350. The first electrode 310 may partially reflect the light generated from the light emitting structure 350 so that an additional optical resonance structure may be provided between the optical resonance layer 150 and the second electrode 320. According to some example embodiments, a second optical resonance distance (L2) may be provided between the upper face of the optical resonance layer 150 and a bottom face of the first electrode 310. Further, a third optical resonance distance (L3) may be provided between an upper face of the first electrode 310 and a bottom face of the second electrode 320. In other words, the display device may include a plurality of optical resonance structures.

When the first electrode 310 is the transparent electrode and one optical resonance structure is provided between the optical resonance layer 150 and the second electrode 320, the first optical resonance distance (L1) may be determined to simultaneously generate optical resonances of the red light, the green light and the blue light. Thus, the display device may have enhanced color purity without adjusting optical distances of respective color pixel regions of the display device. Generally, a display device may have a relative large thickness because an optical distance in the display device increases when the display device includes one optical resonance structure for generating a plurality of peak wavelengths. However, according to example embodiments, the display device may have a thin thickness without requiring additional layers for controlling an optical distance because the insulation layers of the switching structure 200 may be used as an optical distance controlling layer 260.

When the first electrode 310 is the semi-transparent electrode and two or three optical resonance structures are provided between the optical resonance layer 150 and the second electrode 320, the first optical resonance distance (L1) may not be determined to simultaneously generate the optical resonances of the red, the green and the blue lights. For example, each of the first optical resonance distance (L1), the second optical resonance distance (L2), and the third optical resonance distance (L3) may be determined to generate one peak wavelength within the wavelength bands of the visible lights. In example embodiments, the first optical resonance distance (L1), the second optical resonance distance (L2), and the third optical resonance distance (L3) may be determined to generate a first peak wavelength, a second peak wavelength, and a third peak wavelength corresponding to different colors of light having wavelengths within wavelength bands of red light, green light and blue light, respectively. For example, the first resonance distance (L1) may be determined to generate one peak wavelength within a relatively large wavelength band of the red light, and the second resonance distance (L2) may be set to generate another peak wavelength belonging to the wavelength band of the green light. Additionally, the third optical resonance distance (L3) may be determined to generate another peak wavelength within the relatively small wavelength band of the blue light. That is, the first, the second and the third optical resonance distances (L1, L2 and L3) may be determined to respectively generate peak wavelengths corresponding to different colors of light within wavelength bands of the red, the green, and the blue light. Accordingly, the optical resonances of the red, the green, and the blue light may be simultaneously generated using three optical resonance structures among the optical resonance layer 150, the first electrode 310, and the second electrode 320. Thus, the first, the second, and the third optical resonance distances (L1, L2 and L3) may be set to generate peak wavelengths within the wavelength bands of the red, the green, and the blue light, respectively.

Each of the first, the second, and the third optical resonance distances (L1, L2, and L3) may be determined to generate one peak wavelength among three peak wavelengths within the wavelength bands of the red, the green, and the blue light. Thus, the display device may ensure improved characteristics substantially the same as or substantially similar to those of the display device including one optical resonance structure (i.e., the optical resonance structure including the first optical resonance distance (L1)) provided between the optical resonance layer 150 and the second electrode 320. When the first, the second, and the third optical resonance distances (L1, L2, and L3) are determined to cause the optical resonances of the red, the green, and the blue light, respectively, the color pixels of the display device may not require emitting layers having different thicknesses and/or additional subsidiary electrodes having different thicknesses to control respective optical distance relative to the color pixels. Thus, the display device may be manufactured at a low cost without requiring additional layers, electrodes, etc. Furthermore, the color pixels may be obtained without using different masks for each color pixel because all of the color pixels may have substantially same constructions, so the processes for manufacturing the display device may be more simplified.

In some example embodiments, each of the first optical resonance distance (L1), the second optical resonance distance (L2), and the third optical resonance distance (L3) may be determined to simultaneously generate optical resonances of visible light having different wavelengths. For example, each of the first, the second, and the third optical resonance distances (L1, L2 and L3) may be set to simultaneously generate the optical resonances of the red light, the green light, and the blue light. Therefore, the display device may enhance color purity and luminance efficiency.

According to some example embodiments, the third optical resonance distance (L3) may be adjusted by controlling various layers (e.g., the hole transferring layer, the emitting layer, the electron transferring layer, etc) disposed between the first electrode 310 and the second electrode 320. For example, the third optical resonance distance (L3) may be set to generate a peak wavelength within the wavelength band of the blue light.

In case that the third optical resonance distance (L3) is determined, the first optical resonance distance (L1) and/or the second optical resonance distance (L2) may be adjusted by controlling a thickness and/or a refraction index of the switching structure 200 positioned between the optical resonance layer 150 and the first electrode 310. Since the switching structure 200 having various insulation layers are positioned between the optical resonance layer 150 and the first electrode 310, the first and the second optical resonance distances (L1 and L2) may be easily and variously adjusted for desired wavelengths of the lights provided from the light emitting structure 350. For example, the first optical resonance distance (L1) may be adjusted to generate the optical resonance of the red light. Furthermore, the second optical resonance distance (L2) may be controlled to cause the optical resonance of the green light.

As described above, the optical resonances of light having different wavelengths may be simultaneously generated without forming the color pixels having different constructions for emitting different colors of light. Accordingly, manufacturing processes for the display device may be simplified with low cost without requiring emitting layers having different thicknesses and/or forming any additional layers or subsidiary electrodes, because all of the color pixels may have substantially the same or substantially similar constructions. In addition, the thickness of the switching structure 200, including various insulation layers besides the optical distance controlling layer 260, may be precisely controlled. Therefore, the optical resonance distance for generating the optical resonance of the desired wavelengths of the light may be accurately adjusted.

Figure 6:
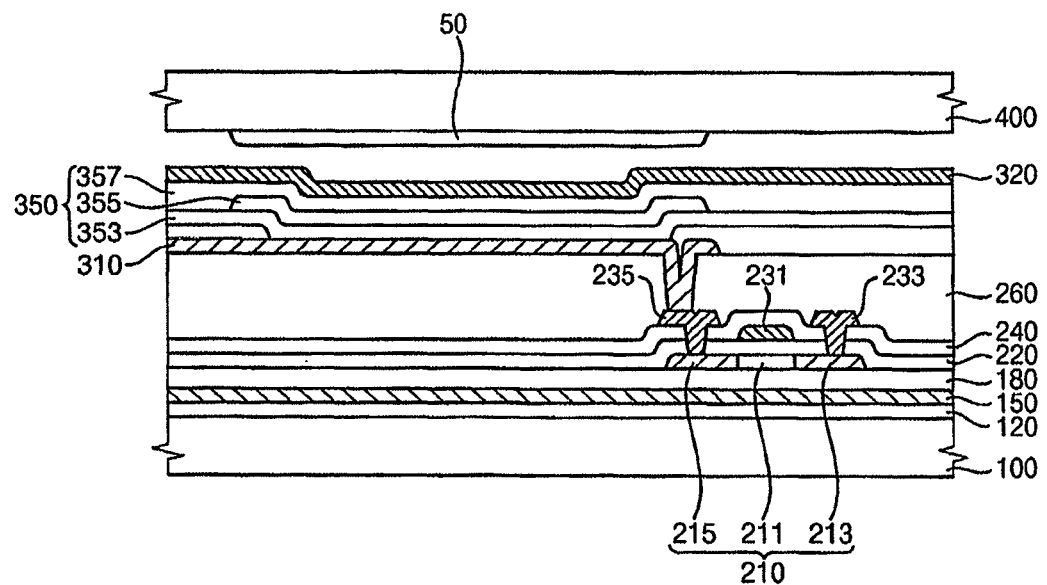
FIG. 6 illustrates a cross sectional view of a display device having an active matrix type in accordance with example embodiments.

FIG. 6 is a cross sectional view illustrating a display device having an active matrix type in accordance with example embodiments. The display device illustrated in FIG. 6 may have a construction substantially the same as or substantially similar to that of the display device described with reference to FIGS. 1 and 2 except for the emission types of the display devices. For example, the display device in FIG. 6 may have a top emission type or a both-sides emission type. Therefore, detailed descriptions of elements of the display device in FIG. 6 substantially the same as or substantially similar to those of the display device in FIGS. 1 and 2 will be omitted or simplified.

Referring to FIG. 6, the display device includes a first substrate 100, a light emitting structure 350 disposed on the first substrate 100, a first electrode disposed between the first substrate 100 and the light emitting structure 350, a second electrode 320 disposed on the light emitting structure 350, and an optical resonance layer 150 separated from the first and the second electrodes 310 and 320.

The display device may further include a switching structure 200 provided between the first substrate 100 and the first electrode 310. The switching structure 200 may include, for example, a switching device such as a driving thin film transistor and a plurality of insulation layers 220, 240, and 260. The switching device illustrated in FIG. 6 may have a top gate structure in which a gate electrode 231 is positioned over a semiconductor layer 210. The switching device may have a bottom gate structure including a gate electrode located below a semiconductor layer.

The switching structure 200 includes an optical distance controlling insulation layer 260. The optical distance controlling insulation layer 260 may protect the switching device and may electrically insulate the switching device from upper structures. The optical distance controlling insulation layer 260 may ensure or adjust at least one predetermined optical distance for the optical resonance of a light emitted from the light emitting structure 350.

The optical distance controlling insulation layer 260 may be spaced apart from the first electrode 310 and the second electrode 320. The optical distance controlling insulation layer 260 may provide at least one optical resonance distance for the optical resonance of the light with respect to at least one of the first electrode 310 and the second electrode 320.

In example embodiments, the display device may have the top emission type. Here, the second electrode 320 may serve as a semi-transparent electrode for partially reflecting and partially transmitting the light, and the optical resonance layer 150 may be reflective.

When the second electrode 320 is the semi-transparent electrode, the second electrode 320 may include a single thin metal film. The second electrode 320 may ensure predetermined reflectivity and desired transmittance. Thus, the thin metal film in the second electrode 320 may have a relatively thin thickness below about 30 nm because a thick metal film has poor luminous efficiency. The second electrode 320 may include silver, an alloy containing silver, aluminum, an alloy containing aluminum, magnesium, an alloy containing magnesium, molybdenum, an alloy containing molybdenum, an alloy of ACA, an alloy of APC, etc. These may be used alone or in a combination thereof.

When the optical resonance layer 150 has reflectivity, the optical resonance layer 150 may include silver, aluminum, platinum, gold, chrome tungsten, molybdenum, titanium, palladium, an alloy thereof, etc. These materials may be used alone or in a mixture thereof.

As for the display device illustrated in FIG. 6, the optical resonance layer 150 is located between the first substrate 100 and the switching structure 200. When the second electrode 320 is semi-transparent and the optical resonance layer 150 is reflective, an upper face of the optical resonance layer 150 and a bottom face of the second electrode 320 may correspond to two faces which the optical resonance of the light may occur. In example embodiments, the optical resonance layer 150 may provide a first optical resonance distance (L1) between the upper face of the optical resonance layer 150 and the bottom face of the second electrode 320. This first optical resonance distance (L1) may be substantially the same as or substantially similar to the first optical resonance distance (L1) described with reference to FIG. 1.

The first optical resonance distance (L1) may be adjusted by controlling thicknesses and/or refraction indices of the insulation layers of the switching structure 200 between the optical resonance layer 150 and the second electrode 320. If an optical distance between the bottom face of the second electrode 320 and a bottom face of the first electrode 310 is previously set, the first optical resonance distance (L1) may be more easily controlled by adjusting a thickness and/or a refraction index of the switching structure 200. The switching structure 200 is located between the optical resonance layer 150 and the second electrode 320.

In example embodiments, the first electrode 310 may serve as a transparent electrode having predetermined transmittance. Alternatively, the first electrode 310 may serve as a semi-transparent electrode having predetermined transmittance. When the first electrode 310 serves as the transparent electrode, an additional optical resonance structure may not be required in the display device. However, an optical resonance structure may be required when an optical resonance structure is between the optical resonance layer 150 and the second electrode 320. Additional optical resonance structures may be provided in the display device besides the optical resonance structure between the optical resonance layer 150 and the second electrode 320 when the first electrode 310 serves as the semi-transparent electrode. For example, a second optical resonance distance (L2) may be provided between the upper face of the optical resonance layer 150 and the bottom face of the first electrode 310. Further, a third optical resonance distance (L3) may be provided between the upper face of the first electrode 310 and the bottom face of the second electrode 320. The second and the third optical resonance distances (L2 and L3) may be substantially the same as or substantially similar to those described with reference to FIG. 1.

According to some example embodiments, the display device may have the both-sides emission type. Here, the second electrode 320 may have desired semi-transmittance for partially reflecting and partially transmitting the light. Furthermore, the optical resonance layer 150 may have predetermined transmittance. When the second electrode 320 and the optical resonance layer 150 are semi-transparent, the upper face of the optical resonance layer 150 and the bottom face of the second electrode 320 may function as two faces for generating the optical resonance of the light. That is, a first optical resonance distance (L1) may be provided between the upper face of the optical resonance layer 150 and the bottom face of the second electrode 320. Additionally, the first electrode 310 may be a transparent electrode having desired transmittance or a reflective electrode having predetermined reflectivity. When the first electrode 310 serves as the reflective electrode, an additional optical resonance structure may be provided in the display device besides an optical resonance structure provided between the optical resonance layer 150 and the second electrode 320 because the first electrode 310 may partially reflect the light. Thus, a second optical resonance distance (L2) may be provided between the upper face of the optical resonance layer 150 and the bottom face of the first electrode 310. Furthermore, a third optical resonance distance (L3) may be provided between the upper face of the first electrode 310 and the bottom face of the second electrode 320. Here, the first and the second optical resonance distances (L2 and L3) may be substantially the same as or substantially similar to those described with reference to FIG. 1.

When the display device has the top emission type or the both-sides emission type, the display device may further include a second substrate 400 corresponding to the first substrate 100. The second substrate 400 may be combined with the first substrate 100 to seal elements of the display device between the first and the second substrates 100 and 400. For example, the first and the second substrates 100 and 400 may be attached each other using a sealing member positioned in peripheral portions of the first and the second substrates 100 and 400.

When the light emitting structure 350 includes a plurality of colored emitting layers for generating different color lights, the display device may additionally include a color filter 50 disposed beneath the second substrate 400 to correspond to the light emitting structure 350. In another example embodiment, the color filter 50 may be omitted when the light emitting structure 350 includes different colored emitting layers disposed in different color pixel regions generating different colors of light. The different color lights may be, for example, red light, green light, blue light.

As described above, the inventive concept according to example embodiments may be employed in various display devices having, for example, the top emission type or the both-sides emission type besides the display device having the bottom emission type.

Figure 7:
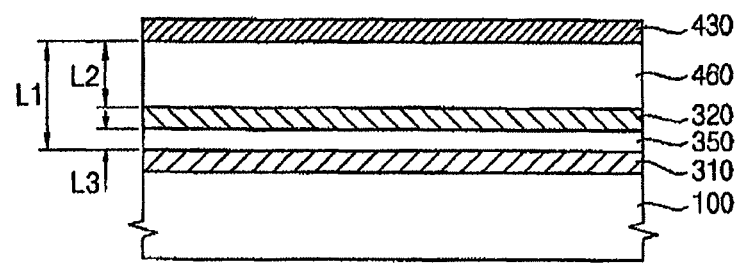
FIG. 7 illustrates a cross sectional view of a display device having an active matrix type in accordance with example embodiments.
Figure 8:
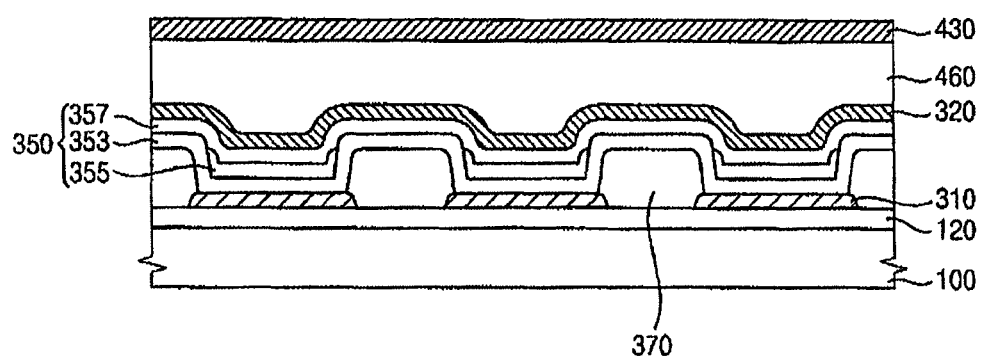
FIG. 8 illustrates a cross sectional view of a display device having an passive bottom emission type in accordance with example embodiments.

FIG. 7 is a cross sectional view illustrating a display device in accordance with example embodiments. FIG. 8 is a cross sectional view illustrating a display device having a passive matrix (PM) type in accordance with example embodiments.

Referring to FIGS. 7 and 8, the display device includes a substrate 100, a first electrode 310, a light emitting structure 350, a second electrode 320, an optical distance controlling layer 460, and an optical resonance layer 430.

The light emitting structure 350 may be disposed between the first electrode 310 and the second electrode 320. The optical distance controlling layer 460 may be located over the first electrode 310, the second electrode 320, and the light emitting structure 350.

When the display device may utilize the mechanism of organic electroluminescent, the light emitting structure 350 may include an organic layer. For example, the light emitting structure 350 may include a hole transferring layer 353, an emitting layer 355 and an electron transferring layer 357. The emitting layer 355 may include different luminous materials relative to different color pixel regions of the display device to generate different colors of light, for example, red light, green light, blue light, etc. In some example embodiments, the emitting layer 355 may include a mixture of different luminous materials generating different colors of light. Alternatively, the emitting layer 355 may have a multi layer structure that includes a plurality of layers for generating the colors of lights, e.g. the red light, the green light, the blue light, etc. Thus, white light may be generated from the emitting layer 355.

In example embodiments, the first electrode 310 may serve as an anode for providing the hole transferring layer 353 with holes. The second electrode 320 may function as a cathode for supplying the electron transferring layer 357 with electrons. To reduce a driving voltage of the display device while enhancing a luminous efficiency thereof, a hole injection layer (HIL) (not illustrated) may be interposed between the first electrode 310 and the hole transferring layer 353. Additionally, an electron injection layer (EIL) may be disposed between the electron transferring layer 357 and the second electrode 320. However, the inventive concept may not be limited to the above-described construction. In some example embodiments, the first electrode 310 and the second electrode 320 may serve as a cathode and an anode, respectively. In this case, an electron transferring layer, an emitting layer, a hole transferring layer, and the second electrode 320 may be successively provided on the first electrode 310.

When the light emitting structure 350 includes a plurality of emitting layers generating different color lights to produce a while light according to some example embodiments, the display device may additionally include a color filter corresponding to the emitting structure 350. Alternatively, the color filter may not be required when the light emitting structure 350 includes different luminous materials for generating different color lights in respective color pixel regions.

The display device may further include a separating insulation layer 370. The separating insulation layer 370 insulates two first electrodes 310 respectively formed in adjacent pixel regions and divides the pixel regions. The separating insulation layer 370 exposes the first electrode 310 to the light emitting structure 350 to electrically connect the first electrode 310 to the light emitting structure 350.

The optical resonance layer 430 is spaced apart from the first electrode 310 and the second electrode 320. According to example embodiments, the optical resonance layer 430 may produce at least one optical resonance distance for the optical resonance of the light generated from the light emitting structure 350 with respect to at least one of the first electrode 310 and the second electrode 320. Since the optical resonance and the optical resonance distance have been already described in detail with reference to FIG. 1 and FIG. 2, any further descriptions will be omitted.

The optical distance controlling layer 460 may be used to adjust at least one optical resonance distance between the optical resonance layer 430 and at least one of the first electrode 310 and the second electrode 320. For example, the optical resonance distance ("L" in the above equation (2)) provided between the optical resonance layer 430 and at least one of the first electrode 310 and the second electrode 320 may be adjusted by controlling at least one of a thickness and a refraction index of the optical distance controlling layer 460 disposed between the optical resonance layer 430 and the second electrode 320.

The optical distance controlling layer 460 may include an organic insulation material or an inorganic insulation material. For example, the optical distance controlling layer 460 may include benzocyclobutene (BCB), polyimide, parylene, polyvinylphenol (PVP), aluminum oxide, barium oxide, magnesium oxide, hafnium oxide, zirconium oxide, calcium oxide, strontium oxide, yttrium oxide, silicon oxide, aluminum nitride, gallium nitride, zinc sulfide, cadmium sulfide, etc. Alternatively, the optical distance controlling layer 460 may include a combination of the above organic and inorganic materials, or may have a hybrid structure that includes at least one organic film containing the above organic insulation material and at least one inorganic film containing the above inorganic insulation material.

The optical resonance layer 430 may have reflectivity when the display device has a bottom emission type. The optical resonance layer 430 may include metal and/or alloy. For example, the optical resonance layer 430 may include silver, aluminum, platinum, gold, chrome, tungsten, molybdenum, titanium, palladium, an alloy thereof, etc. These may be used alone or in a combination thereof.

When the display device has a bottom emission type, the first electrode 310 may be semi-transparent for partially reflecting the incident light and partially transmitting the incident light. The first electrode 310, being semi-transparent, may include a single thin metal film. The first electrode 310 may ensure a desired reflectivity and a predetermined transmittance. Examples of metal in the optical resonance layer 430 may include silver, an alloy containing silver, aluminum, an alloy containing aluminum, magnesium, an alloy containing magnesium, molybdenum, an alloy containing molybdenum, an alloy of AGA, an alloy of APC, etc. These may be used alone or in a combination thereof. In some example embodiments, the first electrode 310 may include other material for reflecting and transmitting an incident light besides the thin metal film. Alternatively, the first electrode 310 may have a multi layer structure that includes at least different transparent or semi-transparent films with different refraction indices.

When the optical resonance layer 430 is reflective and the first electrode 310 is semi-transparent, an upper face of the first electrode 310 and a bottom face of the optical resonance layer 430 may function as two faces between which the optical resonance of the light may occur. In example embodiments, the optical resonance layer 430 may provide a first optical resonance distance (L1) between the upper face of the first electrode 310 and the bottom face of the optical resonance layer 430.

According to example embodiments, the first optical resonance distance (L1) may be determined to simultaneously generate optical resonances of three different wavelengths of visible light, respectively. It is noted that the optical resonance layer 430 does not correspond to the electrodes disposed at both sides of the light emitting structure 350. Since the optical resonance layer 430 is not an electrode or an additional subsidiary electrode, the optical resonance layer 430 may not be patterned in each pixel region. For example, the color pixel regions may not include emitting layers having different thicknesses and additional subsidiary electrodes having different thicknesses may not be required in order to control optical distances relative to the color pixel regions. The optical resonance layer 430 is spaced apart from the second electrode 320 by interposing the optical distance controlling layer 460 therebetween. Accordingly, the first optical resonance distance (L1) may be substantially larger than an optical distance between the first electrode 310 and the second electrode 320.

The first optical resonance distance (L1) may be adjusted by controlling thicknesses and/or refraction indices of a plurality of layers disposed between the optical resonance layer 430 and the first electrode 310. When an optical distance between an upper face of the first electrode 310 and an upper face of the second electrode 320 is previously set, the first optical resonance distance (L1) may be adjusted by controlling a thickness and/or a refraction index of the optical distance controlling layer 460. The optical distance controlling layer is disposed between the second electrode 320 and the optical resonance layer 430. For example, the first optical resonance distance (L1) may be adjusted to have a relatively large value to simultaneously generate the optical resonances of the three different wavelengths of visible light. As described with reference to the above equation (1), the number of the peak wavelengths with the visible wavelength band may increase as the optical resonance distance (L) increases.

In some example embodiments, the first optical resonance distance (L1) may be controlled to generate three peak wavelengths respectively corresponding to those of the red, the green, and the blue light, illustrated in FIG. 4. When the first optical resonance distance (L1) is determined for simultaneously generating the optical resonances of the red, the green and the blue lights, the display device may have improved purity of color without adjusting optical distances of respect color pixel regions of the display device. For example, the color pixel regions may not include emitting layers having different thicknesses and additional subsidiary electrodes having different thicknesses may not be required in order to control optical distances relative to the color pixel regions. Thus, the display device may be manufactured with low cost without requiring additional layers, electrodes, etc. Additionally, the color pixels may be obtained without using different masks relative to the color pixels because all of the color pixels in the display device may have substantially the same constructions. Therefore, the processes for manufacturing the display device may be simplified. Furthermore, the first optical resonance distance (L1) may be adjusted by controlling at least one of a thickness and a refraction index of the optical distance controlling layer 460 disposed between the second electrode 320 and the optical resonance layer 430. Thus, the first optical resonance distance (L1) may be accurately adjusted to cause an optical resonance of light having a desired wavelength.

When the first electrode 310 is semi-transparent, a buffer layer 120 may be disposed between the substrate 100 and the first electrode 310. The buffer layer 120 may include an organic material or an inorganic material having a relatively large refraction index. The buffer layer 120 may have a refraction index substantially larger than that of the substrate 100 or that of the first electrode 310. When the buffer layer 120 having the refraction index larger than that of the first electrode 310 is interposed between the substrate 100 and the first electrode 310, the reflectivity of the light at an interface between the buffer layer 120 and the optical resonance layer 430 may be improved. Additionally, the buffer layer 120 may enhance adhesion strength between the substrate 100 and the first electrode 310.

In example embodiments, the second electrode 320 may function as a transparent electrode having a predetermined transmittance. In other example embodiments, the second electrode 320 may serve as a semi-transparent electrode having a predetermined transmittance. When the second electrode 320 serves as the transparent electrode, an additional optical resonance structure may not be provided. However, an additional optical resonance structure may be provided when the optical resonance structure is between the optical resonance layer 430 and the first electrode 310. Thus, when the second electrode 320 serves as the semi-transparent electrode, the second electrode 320 may partially reflect the light generated from the light emitting structure 350, so that an additional optical resonance structure may be provided between the optical resonance layer 430 and the first electrode 310. According to some example embodiments, a second optical resonance distance (L2) may be provided between the upper face of the second electrode 320 and a bottom face of the optical resonance layer 430. Further, a third optical resonance distance (L3) may be provided between an upper face of the first electrode 310 and a bottom face of the second electrode 320. In other words, the display device may include a plurality of optical resonance structures.

When the second electrode 320 serves as the semi-transparent electrode and two or three optical resonance structures are provided between the upper face of the first electrode 310 and the bottom face of the optical resonance layer 430, the first optical resonance distance (L1) may not be determined to simultaneously cause the optical resonances of the red, the green, and the blue light. For example, each of the first optical resonance distance (L1), the second optical resonance distance (L2), and the third optical resonance distance (L3) may be determined to generate one peak wavelength within the visible wavelength band. In example embodiments, the first optical resonance distance (L1), the second optical resonance distance (L2), and the third optical resonance distance (L3) may be determined to generate a first peak wavelength, a second peak wavelength and a third peak wavelength corresponding to different colors of light having wavelengths within wavelength bands of red light, green light, and blue light, respectively. The first resonance distance (L1) may be determined to generate one peak wavelength within the red wavelength band having relatively long wavelengths, the second resonance distance (L2) may be determined to generate another peak wavelength belonging to the green wavelength band. The third optical resonance distance (L3) may be determined to generate another peak wavelength within the blue wavelength band having relatively shorter wavelengths. Thus, the first, the second, and the third optical resonance distances (L1, L2 and L3) may be determined to respectively generate peak wavelengths corresponding to different colors of light having wavelength bands of the red, the green, and the blue light, respectively. Accordingly, the optical resonances of the red, the green, and the blue light may be simultaneously generated using three optical resonance structures among the optical resonance layer 430, the first electrode 310, and the second electrode 320.

Each of the first, the second, and the third optical resonance distances (L1, L2, and L3) may be determined to generate one peak wavelength among three peak wavelengths belonging to the wavelength bands of the red, the green and the blue light, respectively. Thus, the display device may ensure improved characteristics substantially the same as or substantially similar to those of the display device including one optical resonance structure (i.e., the optical resonance structure including the first optical resonance distance (L1)) provided between the upper face of first electrode 320 and the bottom of the optical resonance layer 430. When the first, the second, and the third optical resonance distances (L1, L2, and L3) are determined to cause the optical resonances of the red, the green, and the blue lights, respectively, the color pixels of the display device may not require emitting layers having different thicknesses and/or additional subsidiary electrodes having different thicknesses to control respective optical distance relative to the color pixels. Therefore, the display device may be manufactured with low cost without requiring additional layers, electrodes, etc. Furthermore, the color pixels may be obtained without using different masks for each color pixel because all of the color pixels divided by the separating insulation layer 370 may have substantially same constructions. Thus, the processes for manufacturing the display device may be more simplified.

In other example embodiments, each of the first optical resonance distance (L1), the second optical resonance distance (L2), and the third optical resonance distance (L3) may be determined to simultaneously generate optical resonances of visible lights having different wavelengths. For example, each of the first, the second and the third optical resonance distances (L1, L2, and L3) may be set to simultaneously generate the optical resonances of the red light, the green light, and the blue light. Therefore, the display device may ensure more enhanced color purity and luminance efficiency.

Figure 9:
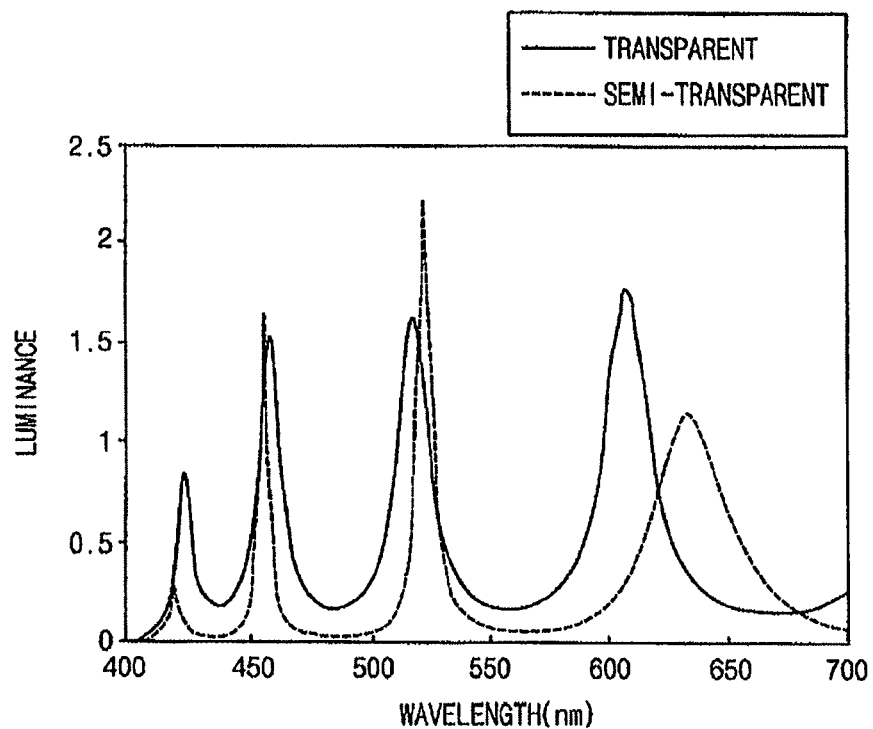
FIG. 9 illustrates a graph comparing luminance of a display device including a semi-transparent second electrode with luminance of a display device including a transparent second electrode in accordance with example embodiments.

FIG. 9 is a graph comparing the luminance of a display device including a semi-transparent second electrode with the luminance of a display device including a transparent second electrode, in accordance with example embodiments. In FIG. 9, a horizontal axis denotes the wavelength of light in nanometers and a vertical axis indicates the luminance of light by an arbitrary unit.

The solid line represents the luminance when the second electrode 320 is transparent, and the dotted line represents the luminance when the second electrode 320 is semi-transparent. When the display device illustrated in FIG. 7 has a bottom emission type, the first electrode 310 may be semi-transparent, and the optical resonance layer 430 may be reflective. When the second electrode 320 serves as a transparent electrode, a single resonance structure may be produced by one reflective layer and one semi-transparent layer. However, when the second electrode 320 functions as a semi-transparent electrode, a multi resonance structure may be produced by one reflective layer and two semi-transparent layers.

As illustrated in FIG. 9, when the second electrode 320 serves as a semi-transparent electrode the blue peak wavelength (i.e., in a range of about 450 nm to about 460 nm in FIG. 9) and the green peak wavelength (i.e., in a range of about 520 nm to about 530 nm in FIG. 9) may be substantially sharper than those when the second electrode 320 functions as a transparent electrode. The sharper peak wavelength represents an enhancement of the color purity. Furthermore, when the second electrode 320 serves as a semi-transparent electrode, the optical resonance distance may be adjusted to produce the red peak wavelength (having a relatively long wavelength within the red wavelength band, i.e. at an upper end thereof, in a range of about 630 nm to about 640 nm in FIG. 9). This relatively long red peak wavelength produces a deep red color light.

Referring now to FIGS. 7 and 8, the third optical resonance distance (L3) may be adjusted by controlling various layers (e.g., a hole transferring layer, an emitting layer, a electron transferring layer, etc) disposed between the first electrode 310 and the second electrode 320. In some example embodiments, the third optical resonance distance (L3) may be set to generate a peak wavelength within the blue wavelength band.

When the third optical resonance distance (L3) is determined, the first optical resonance distance (L1) and/or the second optical resonance distance (L2) may be adjusted by controlling a thickness and/or a refraction index of the optical distance controlling layer 460. The distance controlling layer 460 is disposed between the second electrode 320 and the optical resonance layer 430. Since the thickness and/or the refraction index of the optical distance controlling layer 460 may be easily controlled, the first and the second optical resonance distances (L1 and L2) may be easily and variously adjusted for desired wavelengths of the light provided from the light emitting structure 350. For example, the first optical resonance distance (L1) may be adjusted to generate the optical resonance of the red light. Furthermore, the second optical resonance distance (L2) may be controlled to cause the optical resonance of the green light.

According to some example embodiments, when the display device has a top emission type, the first electrode 310 may serve as a reflective electrode having reflectivity, and the optical resonance layer 430 may be semi-transparent. When the first electrode 310 is reflective and the optical resonance layer 430 is semi-transparent, an upper face of the first electrode 310 and a bottom face of the optical resonance layer 430 may serve as two faces between which the optical resonance of the light may occur. In example embodiments, the optical resonance layer 430 may provide a first optical resonance distance (L1) between the upper face of the first electrode 310 and the bottom face of the optical resonance layer 430. In some example embodiments, the first optical resonance distance (L1) may be adjusted to simultaneously generate optical resonances of visible light having three different wavelengths.

In some example embodiments, the second electrode 320 may be a transparent electrode having predetermined transmittance, or may serve as a semi-transparent electrode that has predetermined semi-transmittance. When the second electrode 320 functions as the transparent electrode, an additional optical resonance structure may not be provided. However, an additional optical resonance structure may be provided when the optical resonance structure is between the optical resonance layer 430 and the first electrode 310. Thus, when the second electrode 320 serves as the semi-transparent electrode, the second electrode 320 may partially reflect the light generated from the light emitting structure 350, so that an additional optical resonance structure may be provided between the optical resonance layer 430 and the first electrode 310. According to some example embodiments, a second optical resonance distance (L2) may be provided between the upper face of the second electrode 320 and a bottom face of the optical resonance layer 430. Furthermore, a third optical resonance distance (L3) may be provided between an upper face of the first electrode 310 and a bottom face of the second electrode 320. In other words, the display device may include a plurality of optical resonance structures. Since the first, second and the third optical resonance distances (L1, L2 and L3) have been already described in detail, further descriptions will be omitted.

According to some example embodiments, when the display device has a both-sides emission type, each of the first electrode 310 and the optical resonance layer 430 may be semi-transparent. When the first electrode 310 and the optical resonance layer 430 are semi-transparent, an upper face of the first electrode 310 and a bottom face of the optical resonance layer 430 may function as two faces between which the optical resonance of the light may occur. In example embodiments, the optical resonance layer 430 may provide a first optical resonance distance (L1) between the upper face of the first electrode 310 and the bottom face of the optical resonance layer 430. In some example embodiments, the second electrode 320 may serve as a transparent electrode having predetermined transmittance, or may function as a semi-transparent electrode having predetermined transmittance. When the second electrode 320 serves as the semi-transparent electrode, the second electrode 320 may partially reflect the light generated from the emitting structure 350, so that an additional optical resonance structure may be provided between the optical resonance layer 430 and the first electrode 310. In other words, the display device may include a plurality of optical resonance structures. Since the plurality of optical resonance structures have been already described in detail, further descriptions will be omitted.

According to some example embodiments, when the display device has the top emission type or the both-sides emission type, the display device may further include a facing substrate (for example, referring to the reference number 400 in FIG. 6) opposed to the substrate 100. The facing substrate may be combined with the substrate 100 to seal elements of the display device between the two substrates. For example, the two substrates 100 and 400 may be attached each other using a sealing member positioned peripheral portions of the two substrates 100 and 400. As described above, the inventive concept according to example embodiments may be employed in various display devices having, for example, the top emission type or the both-sides emission type besides the display device having the bottom emission type.

Figure 10A:
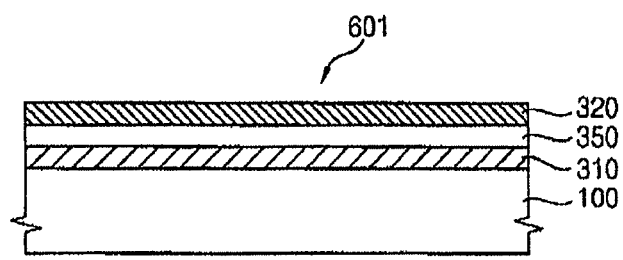
FIGS. 10A to 10C illustrate cross sectional views of stages of a method of manufacturing a display device in accordance with example embodiments.
Figure 10B:
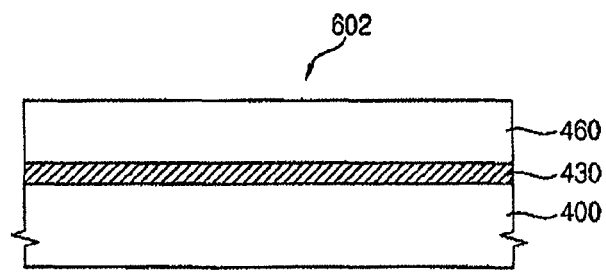
Figure 10C:
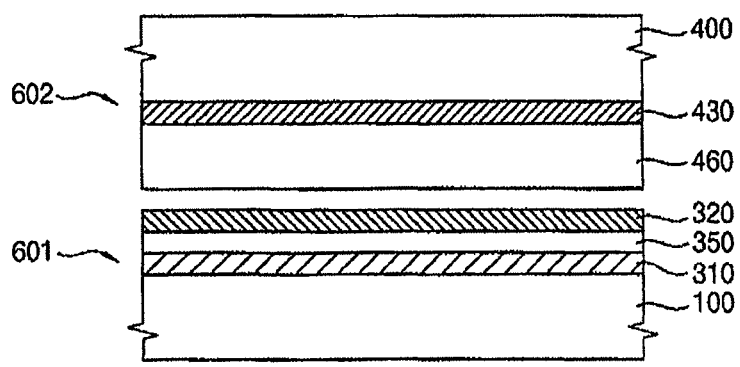

FIGS. 10A to 10C are cross sectional views illustrating stages in a method of manufacturing a display device in accordance with example embodiments.

Referring to FIG. 10A, a first electrode 310 is formed on a first substrate 100. The first electrode 310 may be patterned in each pixel region by a photolithography process. For example, the first electrode 310 may be patterned in each pixel region through an exposure process, a developing process, and an etching process using a photoresist as a mask. In some example embodiments, the first electrode 310 may be semi-transparent when the display device has a bottom emission type, a both-sides emission type, or may be reflective when the display device has a top emission type.

A light emitting structure 350 is formed on the first electrode 310. When the display device utilizes the mechanism of organic electroluminescent, the light emitting structure 350 may include a hole transferring layer 353, an emitting layer 355 and an electron transferring layer 357 described with reference to FIG. 8.

A second electrode 320 is formed on the light emitting structure 350. The second electrode 320 may be transparent or may be semi-transparent. The second electrode 320 may not be patterned in each pixel region, unlike the first electrode 310. Accordingly, a first unit 601 includes the first electrode 310, the light emitting structure 350, and the second electrode 320 formed on the first substrate 100.

Referring to FIG. 10B, an optical resonance layer 430 is formed on a second substrate 400. The optical resonance layer 430 may not be patterned in each pixel region. In some example embodiments, the optical resonance layer 430 may be reflective when the display device has the bottom emission type, or may be semi-transparent when the display device has the top emission type or the both-sides emission type.

An optical distance controlling layer 460 is formed on the optical resonance layer 430. As described with reference to FIG. 7, an optical resonance distance (e.g., a first optical resonance distance (L1) in FIG. 7) may be adjusted by controlling a thickness and/or a refraction index of the optical distance controlling layer 460 disposed between the second electrode 320 and the optical resonance layer 430. Accordingly, a second unit 602 including the optical resonance layer 430 and the optical distance controlling layer 460 is provided.

Referring to FIG. 10C, the second unit 602 including the optical resonance layer 430 and the optical distance controlling layer 460 is disposed over the first unit 601 including the first electrode 310, the light emitting structure 350, and the second electrode 320. Then, the first unit 601 and the second unit 602 are combined. For example, the two substrates 100 and 400 may be attached to each other using a sealing member positioned in peripheral portions of the two substrates 100 and 400. As described above, the first unit 601 and the second unit 602 are separately formed. Then, the separately formed first and second units 601 and 602 are combined each other to manufacture the display device having a construction substantially the same as or substantially similar to that of the display device described with reference to in FIG. 7.

Figure 11:
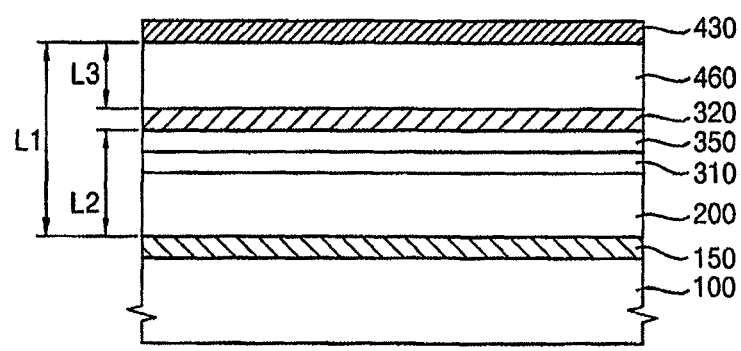
FIG. 11 illustrates a cross sectional view of a display device in accordance with example embodiments.
Figure 12:
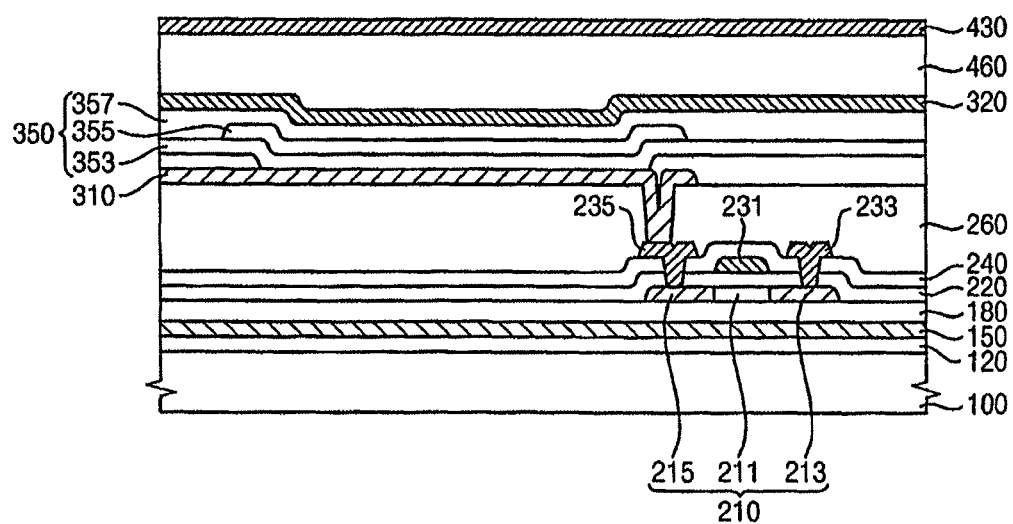
FIG. 12 illustrates a cross sectional view of a display device having an active matrix type in accordance with example embodiments.

FIG. 11 is a cross sectional view illustrating a display device in accordance with example embodiments. FIG. 12 is a cross sectional view illustrating a display device having an active matrix type in accordance with example embodiments.

Referring to FIGS. 11 and 12, the display device includes a substrate 100, a first optical resonance layer 150, a switching structure 200, a first electrode 310, a light emitting structure 350, a second electrode 320, an optical distance controlling layer 460, and a second optical resonance layer 430. The switching structure 200 may be disposed between the first optical resonance layer 150 and the first electrode 310, and the light emitting structure 350 is disposed between the first electrode 310 and the second electrode 320. The optical distance controlling layer 460 is disposed between the second electrode 320 and the second optical resonance layer 430. The second optical resonance layer 430 is disposed over the first electrode 310, the second electrode 320, and the light emitting structure 350.

A semiconductor layer 210, a plurality of electrodes 231, 233 and 235 and a plurality of insulation layers 220, 240 and 260, which are elements of the switching structure 200, may be substantially the same as or substantially similar to those described with reference to FIG. 2. The elements of the switching structure 200 have been already described with reference to FIG. 2, and thus any further description will be omitted. Furthermore, a hole transferring layer 353, an emitting layer 355, and an electron transferring layer 35 has already been described with reference to FIG. 2, and thus any further description will be omitted.

According to some example embodiments illustrated in FIG. 11 and FIG. 12, the display device includes at least two optical resonance layers 150 and 430, each of which is not an electrode. Thus, an optical resonance structure may be provided between the first optical resonance layer 150 and the second optical resonance layer 430. Furthermore, since the first optical resonance layer 150 and the second optical resonance layer 430 do not serve as an electrode or a subsidiary electrode, the first optical resonance layer 150 and the second optical resonance layer 430 may not be patterned in each pixel region. Moreover, according to some example embodiments illustrated in FIG. 11 and FIG. 12, an optical resonance distance between the first optical resonance layer 150 and the second optical resonance layer 430 may be adjusted by simultaneously or respectively controlling thicknesses and/or refraction indices of the switching structure 200 and the optical distance controlling layer 460.

When the display device has a bottom emission type, the first optical resonance layer 150 may be semi-transparent, and the second optical resonance layer 430 may be reflective. When the first optical resonance layer 150 is semi-transparent and the second optical resonance layer 430 is reflective, an upper face of the first optical resonance layer 150 and a bottom face of the second optical resonance layer 430 may serve as two faces between which the optical resonance of the light may occur. In example embodiments, a first optical resonance distance (L1) may be provided between the upper face of the first optical resonance layer 150 and the bottom face of the second optical resonance layer 430.

As described with reference to FIG. 1 or FIG. 7, the first optical resonance distance (L1) may be determined to simultaneously generate optical resonances of three visible lights having different wavelengths, respectively. For example, the first optical resonance distance (L1) may be controlled to generate three peak wavelengths respectively corresponding to those of the red, the green and the blue lights. Since an optical distance between the upper face of the first optical resonance layer 150 and the bottom face of the second optical resonance layer 430 is substantially longer than an optical distance between the first electrode 310 and the second electrode 320, the first optical resonance distance (L1) may be adjusted to have a relatively large value to simultaneously generate the optical resonances of the three different visible lights. The first optical resonance distance (L1) may be adjusted to simultaneously generate optical resonances of three visible lights having different wavelengths, respectively, have been already described in detail. Thus, any further description will be omitted.

The first optical resonance distance (L1) may be adjusted by simultaneously or respectively controlling thicknesses and/or refraction indices of the switching structure 200 and the optical distance controlling layer 460. Therefore, the first optical resonance distance (L1) may be more accurately and easily adjusted in comparison with the case that only one of the switching structure 200 and the optical distance controlling layer 460 is provided.

In some example embodiments, each of the first electrode 310 and the second electrode 320 may serve as a transparent electrode having predetermined transmittance. When both the first electrode 310 and the second electrode 320 are transparent, an additional optical resonance structure may not be provided. However, an additional optical resonance structure may be provided when the optical resonance structure is between the first optical resonance layer 150 and the second optical resonance layer 430. In other example embodiments, one of the first electrode 310 and the second electrode 320 may function as a semi-transparent electrode having predetermined semi-transmittance. For example, when the second electrode 320 serves as the semi-transparent electrode, the second electrode 320 may partially reflect the light generated from the light emitting structure 350, so that an additional optical resonance structure may be provided between the first optical resonance layer 150 and the second optical resonance layer 430. According to some example embodiments, a second optical resonance distance (L2) may be provided between the upper face of the first optical resonance layer 150 and a bottom face of the second electrode 320. Further, a third optical resonance distance (L3) may be provided between an upper face of the second electrode 320 and the bottom face of the second optical resonance layer 430. In other words, the display device may include a plurality of optical resonance structures.

In some example embodiments, the first optical resonance distance (L1), the second optical resonance distance (L2) and the third optical resonance distance (L3) may be determined to respectively generate a first peak wavelength, a second peak wavelength, and a third peak wavelength corresponding to different colors of light having wavelengths within wavelength bands of red light, green light, and blue light, respectively. In other example embodiments, each of the first optical resonance distance (L1), the second optical resonance distance (L2), and the third optical resonance distance (L3) may be determined to simultaneously generate optical resonances of visible light having different wavelengths. For example, each of the first, the second, and the third optical resonance distances (L1, L2 and L3) may be set to simultaneously generate the optical resonances of red light, green light, and blue light. Therefore, the display device may ensure more enhanced color purity and luminance efficiency.

When an optical distance between a bottom face of the second electrode 320 and a bottom face of the first electrode 310 is previously set by controlling various layers (e.g., the hole transferring layer, the emitting layer, the electron transferring layer, etc) disposed between the first electrode 310 and the second electrode 320, the second optical resonance distance (L2) may be adjusted by controlling a thickness and/or a refraction index of the switching structure 200 between the first electrode 310 and the optical resonance layer 150. Furthermore, when the second optical resonance distance (L2) is determined, the third optical resonance distance (L3) may be adjusted by controlling a thickness and/or a refraction index of the optical distance controlling layer 460 disposed between the second electrode 320 and the second optical resonance layer 430. Since the thickness and/or the refraction index of the optical distance controlling layer 460 may be easily controlled, the first and the third optical resonance distances (L1 and L3) may be easily and variously adjusted for desired wavelengths of the light provided from the emitting structure 350. For example, the first optical resonance distance (L1) may be adjusted to generate the optical resonance of the red light. Furthermore, the second optical resonance distance (L2) may be controlled to cause the optical resonance of the green light and the third optical resonance distance (L3) may be controlled to cause the optical resonance of the blue light.

When the display device has a top emission type, the first optical resonance layer 150 may be reflective and the second optical resonance layer 430 may be semi-transparent. When the first optical resonance layer 150 is reflective and the second optical resonance layer 430 is semi-transparent, an upper face of the first optical resonance layer 150 and a bottom face of the second optical resonance layer 430 may function as two faces between which the optical resonance of the light may occur. In some example embodiments, each of the first electrode 310 and the second electrode 320 may serve as a transparent electrode having predetermined transmittance. According to one example embodiment, one of the first electrode 310 and the second electrode 320 may function as a semi-transparent electrode having predetermined transmittance. For example, when the second electrode 320 serves as the semi-transparent electrode, the second electrode 320 may partially reflect the light generated from the light emitting structure 350, so that an additional optical resonance structure may be provided. In other words, the display device may include a plurality of optical resonance structures. Since the plurality of optical resonance structures have been already described in detail, further descriptions will be omitted.

When the display device has a both-sides emission type, each of the first optical resonance layer 150 and the second optical resonance layer 430 may be semi-transparent. When both the first optical resonance layer 150 and the second optical resonance layer 430 are semi-transparent, an upper face of an upper face of the first optical resonance layer 150 and a bottom face of the second optical resonance layer 430 may serve as two faces between which the optical resonance of the light may occur. In some example embodiments, each of the first electrode 310 and the second electrode 320 serve as a transparent electrode having predetermined transmittance. According to an example embodiment, one of the first electrode 310 and the second electrode 320 may function as a semi-transparent electrode having predetermined transmittance. For example, when one of the first electrode 310 and the second electrode 320 serves as the semi-transparent electrode, the semi-transparent electrode may partially reflect the light generated from the light emitting structure 350, so that an additional optical resonance structure may be provided. Since the plurality of optical resonance structures have been already described in detail, further descriptions will be omitted.

A method of manufacturing of the display device illustrated in FIG. 11 may be substantially the same as or substantially similar to the method described with reference to FIGS. 10A, 10B, and 10C, except that a first optical resonance layer 150 and a switching structure 200 are further formed between a first substrate 100 and a first electrode 310. Therefore, further description will be omitted.

As described above, according to example embodiments illustrated in FIG. 11, an optical resonance structure may be provided between at least two optical resonance layers 150 and 430, each of which does not serve as an electrode. Furthermore, the optical resonance distance between the two optical resonance layers 150 and 430 may be adjusted by simultaneously or respectively controlling thicknesses and/or refraction indices of the switching structure 200 and the optical distance controlling layer 460. Therefore, the first optical resonance distance (L1) may be more accurately and easily adjusted.

Figure 13:
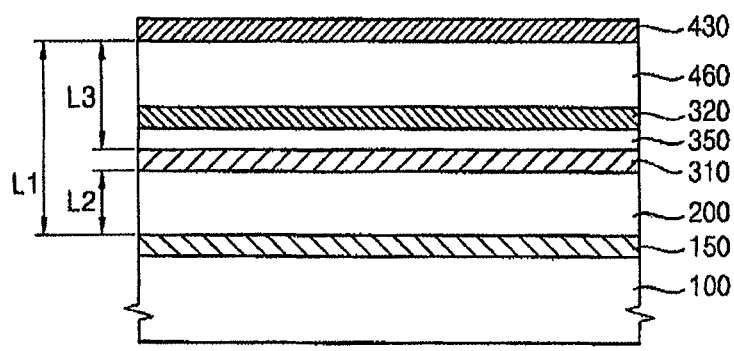
FIG. 13 illustrates a cross sectional view of a display device in accordance with example embodiments.

FIG. 13 is a cross sectional view illustrating a display device in accordance with example embodiments.

The display device illustrated in FIG. 13 may have a construction substantially the same as or substantially similar to that of the display device described with reference to FIG. 11 except that a first electrode 310 is semi-transparent and a second electrode 320 is transparent. Therefore, detailed descriptions of elements of the display device in FIG. 13 substantially the same as or substantially similar to those of the display device in FIG. 11 will be omitted or simplified.

Referring to FIG. 13, the display device includes a substrate 100, a first optical resonance layer 150, a switching structure 200, a first electrode 310, a light emitting structure 350, a second electrode 320, an optical distance controlling layer 460 and a second optical resonance layer 430. The switching structure 200 may be disposed between the first optical resonance layer 150 and the first electrode 310, and the light emitting structure 350 is disposed between the first electrode 310 and the second electrode 320. The optical distance controlling layer 460 is disposed between the second electrode 320 and the second optical resonance layer 430, and the second optical resonance layer 430 is disposed over the first electrode 310, the second electrode 320, and the light emitting structure 350.

When the display device has a bottom emission type, the first optical resonance layer 150 may be semi-transparent, and the second optical resonance layer 430 may be reflective. When the first optical resonance layer 150 is semi-transparent and the second optical resonance layer 430 is reflective, an upper face of the first optical resonance layer 150 and a bottom face of the second optical resonance layer 430 may serve as two faces between which the optical resonance of the light may occur. In example embodiments, a first optical resonance distance (L1) may be provided between an upper face of the first optical resonance layer 150 and the bottom face of the second optical resonance layer 430.

The first electrode 310 may be semi-transparent, and the second electrode 320 may be transparent. When the first electrode 310 is semi-transparent, the first electrode 310 may partially reflect the light generated from the light emitting structure 350. The first electrode 310 may partially reflect the light generated from the light emitting structure 350, such that an additional optical resonance structure may be provided in addition to the optical resonance structure provided by the first optical resonance layer 150 and a bottom face of the second optical resonance layer 430. For example, a second optical resonance distance (L2) may be provided between the upper face of the first optical resonance layer 150 and a bottom face of the first electrode 310. Further, a third optical resonance distance (L3) may be provided between an upper face of the first electrode 310 and the bottom face of the second optical resonance layer 430. In other words, the display device may include a plurality of optical resonance structures. Because the plurality of optical resonance structures has been already described in detail, any further descriptions will be omitted.

When the display device has a top emission type, the first optical resonance layer 150 may be reflective, and the second optical resonance layer 430 may be semi-transparent. When the display device has a both-sides emission type, both the first optical resonance layer 150 and the second optical resonance layer 430 may be semi-transparent.

By way of summation and review, according to embodiments described above, the display device may have improved color purity and enhanced luminance efficiency without adjusting optical distances of respect color pixel regions of the display device because at least one optical resonance distance may be determined for simultaneously causing the optical resonances of the red, the green and the blue lights. That is, the color pixel regions may not include light emitting layers having different thicknesses and additional subsidiary electrodes having different thicknesses may not be required in order to control optical distances relative to the color pixel regions. Hence, the display device may be manufactured with low cost without requiring additional layers, electrodes, etc. Additionally, the color pixels may be obtained without using different masks relative to the color pixels because all of the color pixels in the display device may have substantially same constructions. Therefore, the processes for manufacturing the display device may be considerably simplified. Furthermore, the thickness of the optical distance controlling insulation layer and/or the optical distance controlling layer may be easily and precisely controlled, and thus at least one optical resonance distance may also be accurately adjusted to cause an optical resonance of light having a desired wavelength.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A method of manufacturing a display device, the method comprising:
   forming a first unit on a first substrate, the first unit including a first electrode, an emitting structure, and a second electrode;
   forming a second unit on a second substrate, the second unit including a first optical resonance layer and an optical distance controlling layer having a uniform thickness, and the first and second units being formed separately; and
   combining the first unit with the second unit such that the first unit is located between the first substrate and the second unit, and the first optical resonance layer is between the second substrate and the second electrode,
   wherein the second electrode and the first optical resonance layer cause an optical resonance of a light generated from the light emitting structure by providing a first optical resonance distance corresponding to a distance between an upper face of the first optical resonance layer and a bottom face of the second electrode.

2. The method as claimed in claim 1, wherein forming the first unit further comprises forming a second optical resonance layer and a switching structure between the first substrate and the first electrode.

3. The method as claimed in claim 2, wherein forming the switching structure comprises:
   forming a switching device between the first substrate and the first electrode; and
   forming an optical distance controlling insulation layer covering the switching device.

4. The method as claimed in claim 3, wherein forming the first unit further comprises forming the first electrode on the switching structure, forming the emitting structure on the first electrode, and forming the second electrode on the emitting structure.

5. The method as claimed in claim 1, wherein forming the second unit further comprises adjusting the first optical resonance distance such that optical resonances of red light, green light, and blue light are simultaneously generated from the emitting structure.

6. The method as claimed in claim 5, wherein adjusting the first optical resonance distance further comprises controlling at least one of a thickness of the optical distance controlling layer and a refraction index of the optical distance controlling layer.

7. The method as claimed in claim 1, wherein forming the second unit further comprises forming the first optical resonance layer such that the first optical resonance layer is semi-transparent.

8. The method as claimed in claim 1, wherein forming the second unit further comprises forming the first optical resonance layer such that the first optical resonance layer is reflective.

9. The method as claimed in claim 1, wherein forming the second unit further comprises forming the first optical resonance layer such that the first optical resonance layer includes metal.

10. The method as claimed in claim 1, wherein forming the first unit further comprises forming the first electrode such that the first electrode is transparent or semi-transparent.

11. The method as claimed in claim 1, wherein forming the first unit further comprises forming the second electrode such that the second electrode is reflective or semi-transparent.

12. The method as claimed in claim 1, wherein combining the first and second units is performed such that light emitted from the emitting structure is emitted away from the second unit.

13. The method as claimed in claim 1, wherein forming the second unit includes:
- forming the first optical resonance layer of metal;
- forming the optical distance controlling layer of an insulating material; and
- adjusting thicknesses of the first optical resonance layer and the optical distance controlling layer to simultaneously generate optical resonances of red light, green light, and blue light generated from the light emitting structure.

14. The method as claimed in claim 1, wherein forming the second unit includes forming the first optical resonance layer between the second substrate and the optical distance controlling layer.

15. The method as claimed in claim 14, wherein combining the first unit with the second unit includes arranging the optical distance controlling layer in direct contact with the second electrode.

16. The method as claimed in claim 1, wherein forming the first optical resonance layer and the optical distance controlling layer on the second substrate is completed, before combining the first and second units.

* * * * *